United States Patent [19]

Dubois et al.

[11] 4,041,190

[45] Aug. 9, 1977

[54] METHOD FOR PRODUCING A SILICA MASK ON A SEMICONDUCTOR SUBSTRATE

[75] Inventors: Jean-Claude Dubois; Maryse Gazard, both of Paris, France

[73] Assignee: Thomson-CSF, Paris, France

[21] Appl. No.: 532,691

[22] Filed: Dec. 13, 1974

Related U.S. Application Data

[63] Continuation-in-part of Ser. No. 264,235, June 19, 1972, abandoned.

[30] Foreign Application Priority Data

June 29, 1971 France ............................ 71.23624

[51] Int. Cl.² ............................................. B05D 3/06
[52] U.S. Cl. ................................ 427/43; 148/1.5; 427/95
[58] Field of Search .................... 427/43, 387, 95; 204/159.13; 148/1.5

[56] References Cited

U.S. PATENT DOCUMENTS

| | | |
|---|---|---|
| 3,046,207 | 7/1962 | Miller ............................ 204/159.13 |
| 3,055,776 | 9/1962 | Stevenson et al. ............................ 427/95 |
| 3,056,735 | 10/1962 | Smith-Johannsen ............ 204/159.13 |
| 3,086,892 | 4/1963 | Huntington ............................ 427/95 |
| 3,179,546 | 4/1965 | Fischer ............................ 204/159.13 |
| 3,617,187 | 11/1971 | Chitrin ............................ 204/159.13 |
| 3,627,836 | 12/1971 | Getson ............................ 204/159.13 |
| 3,632,399 | 1/1972 | Burlant ............................ 204/159.13 |
| 3,681,113 | 8/1972 | Yoldas ............................ 106/38.3 |
| 3,718,474 | 2/1973 | Kolb et al. ............................ 204/159.2 |
| 3,825,466 | 7/1974 | Martin et al. ............................ 427/43 |
| 3,836,598 | 9/1974 | Wheeler ............................ 204/159.13 |
| 3,865,588 | 2/1975 | Ohto et al. ............................ 204/159.13 |
| 3,877,980 | 4/1975 | Martin et al. ............................ 427/43 |

*Primary Examiner*—Bernard D. Pianalto
*Assistant Examiner*—Sadie L. Childs
*Attorney, Agent, or Firm*—Cushman, Darby & Cushman

[57] ABSTRACT

A high precision silica coating, is provided. A thin film of a resin, from the polysiloxane group, for instance polyvinylsiloxane, is irradiated by 10,000 electron-volts. The resin converts in an insoluble product in the areas exposed according a predetermined pattern. After a heat treatment in oxidizing atmosphere, the remainder of the film is eliminated.

7 Claims, No Drawings

METHOD FOR PRODUCING A SILICA MASK ON A SEMICONDUCTOR SUBSTRATE

CROSS-REFERENCE TO RELATED APPLICATIONS

This application is a continuation-in-part of our earlier copending application Ser. No. 264,235, filed June 19, 1972, now abandoned.

BACKGROUND OF THE INVENTION

The object of the invention is to provide an insulating coating at predetermined regions of a substrate, with an accuracy in the order of one micron. Such a coating must have good dielectric qualities, and also provide a mask i.e. a layer impervious to penetration of any solid, liquid or gas into the substrate, in particular in the case of semiconductor substrates.

The conventional methods used to obtain this result can be split into two main classes:

1. First class

In this class, a uniform layer of an insulator such as silica, silicon nitride or a metal oxide (titanium oxide, tantalum oxide or aluminium oxide) is formed or deposited upon the substrate. This layer is chemically etched in accordance with the pattern of a mask.

A drawback of these methods is their lack of accuracy.

2. Second class

In this class a coating is produced with the aid of organic resins which are sensitive to photons or electrons. In order to obtain good-quality insulating areas, resins are chosen which, under the effect of photons or electrons, undergo a chemical process known as "cross-linking". This transformation is due to an interaction (which involves the creation of lateral bonds) between neighbouring substantially parallel chains of polymerized molecules. The cross-linked resin becomes resistant to the action of certain organic solvents. Accordingly, a solvent of this kind is used to develop a pattern obtained by photographic exposure or electronic irradiation carried out through an appropriate mask.

A drawback of these methods is the lower strength of the coating, in comparison with silica, silicon nitride or metal oxide layers.

BRIEF SUMMARY OF THE INVENTION

The invention overcomes these drawbacks.

According to the invention, the method producing a silica coating on predetermined areas of a substrate, comprises the following steps: 1. depositing a thin film of organic resin upon said substrate, said resin consisting of polysiloxane of structure:

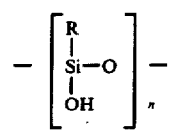

where $n$ is an integer ranging from 2 to about 30, and where R belongs to the following group of radicals: alkyl, aryl and alkenyl;

2. irradiating and scanning said film by an electron beam according to the predetermined pattern of said coating;

3. thermal treatment of said substrate in a furnace and in oxidizing atmosphere at a temperature ranging from 500° to 1000° C for about two hours.

The principle of the invention is founded on the following basis

A homopolymeric substance having a structure as described by the hereabove formula, placed in certain conditions of irradiation (hereafter stated in the specification) undergoes a cross-linking, leading to a new structure such as the following:

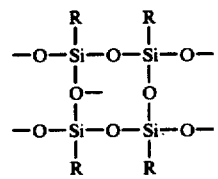

A copolymeric substance of structure:

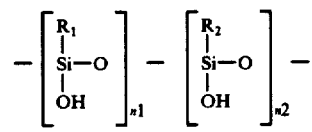

where $n_1$ and $n_2$ are integers (the sum $n_1 + n_2$ being less than 30) and where $R_1$ and $R_2$ are two different radicals belonging to the above group (alkyl, aryl and alkenyl), placed in similar conditions of irradiation, undergoes a crosslinking leading to structures, as for instance:

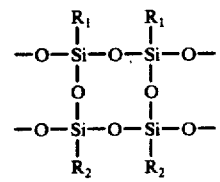

The use of these copolymers is an intergral part of the invention.

Polysiloxanes are known and described in the chemical literature, as for instance in the book "Principles of Polymerization" by George Odlan, published by Mc Graw Hill Book Company (New York), As stated in this publication at paragraph 2-6-b-4 (Polysiloxanes), the products are synthesized from chlorosilanes by hydrolization followed by polymerization of the silanol thus formed, giving a product consisting of a mixture of cyclic and linear polymers of different sizes. The composition of the product varies considerably depending on the reaction conditions.

DETAILED DESCRIPTION OF THE INVENTION

An embodiment of the invention is described hereafter, as an example, in the case of the polyvinylsiloxane, i.e. the case where, in the above first formula, R is the radical:

$C_2H_3$

The steps are the following: Previous step: preparation of the polyvinyl siloxane. First step: Depositing of the resin film. Second step: Irradiating and scanning the resin film. Third step: Thermal treatment.

Previous step: Preparation of the polyvinylsiloxane:

Vinyltrichlorosilane is hydrolysed in accordance with the formula:

$$C_2H_3SiCl_3 + 3H_2O \rightarrow C_2H_3Si(OH)_3 + 3HCL$$

The procedure is as follows: a large quantity of high-purity ethyl ether (in the order of 1 to 2 liters for the hydrolysis of around a fifth of a molecule-gramme) is maintained at between 0° and 5° C and constantly stirred by an agitator. Into this there is dropped vinyltrichlorosilane and a quantity of water very much in excess of that required for hydrolysis, this latter in the form of crushed ice; agitation of the mixture is continued until the liquid separates into two superimposed layers. The liquid is decanted and the top layer separated. This top layer contains the unpolymerised organic resin in solution in the ether. Its polymerisation is triggered by the addition of a drop of concentrated ammonia (around 1 millilitre for the aforesaid quantities of ether and trichlorovinylsilane). A complete polymerization is achieved after 3 hours and a half, the temperature ranging between 0° and 5° C.

The polymerised resin is then separated from the remainder of the liquid. After rinsing and drying, on soda sulphate and anhydride, progressive concentration is carried out, initially at atmospheric pressure and then by evaporation under vacuo at ambient temperature. In this way a powered product is obtained.

First step — Depositing the resin film.

The powdered polyvinylsiloxane obtained in the previous step is dissolved in an organic solvent, for example isopropyl alcohol or other solvents such as acetones, alcohols, and aromatic carbides. The solution is deposited upon the substrate which latter has at least one flat optically polished surface which is perfectly clean. It is horizontally disposed upon a support rotating at high speed about a vertical axis. After evaporation in a flow of dry filtered air, at ambient temperature, there is produced upon the support a resin film having a uniform thickness in the order of 0.2 to 1 micron.

As a variant form of this step, a process of atomising in the form of very fine droplets (aerosol spray) on the appropriate face of the substrate when the latter is in position on a fixed support, can be used.

Second step — Irradiating and scanning the resin film.

The substrate, covered with the resin layer produced in the present first step, is placed upon the specimen-holder plate of a known kind of "electronic masking device". The electron energy can vary from around 10,000 to 30,000 electron-volts. The width of the electron-beam at the point of intersection with the surface of the resin, is in the order of 0.01 to 1 micron in diameter. Those skilled in the art will realise that for thin resin films, having a thickness of at the most two microns, and belonging to the polysiloxane group, the quantity of electricity transferred by the cathode-ray and required for the cross-linking operation, is independant of the thickness. By contrast, the quantity per unit area varies radically depending upon the type of resin. It is in the order of one coulomb per square meter for the conventional resins. By contrast, in the case of polyvinylsiloxane (and this is a peculiarity which is exploited by the invention) the quantity of electricity is only 0.05 coulombs per $m^2$. By way of an example of the order of magnitude, bombardment of a 1 $m^2$ mask requires a time of some few minutes using a beam of $10^{-10}$ amp.

Third step: thermal treatment

After the elimination of the non-bombarded areas with the help of a solvent, for example acetone, the substrate and remaining film forming the mask are processed during two hours in a furnace which has been raised to a constant internal temperature of around 800° C, in an oxidizing atmosphere, containing for example 50% argon or nitrogen and 50% oxygen.

The silicon deposit thus obtained, under infra-red spectrography, shows no trace of carbon radicals. It is a silica deposit of dielectric constant in the order of 5 and its breakdown voltage is in the order of $10^7$ volts per cm The annealing operation is accompanied by a reduction in thickness of around 50 to 55%.

In accordance with one variant embodiment of the invention, the second step is replaced by a photographic process. The resin is not cross-linked. In this case, the thermal treatment can convert the resin into silica, if the furnace temperature rises very slowly from the ambient temperature to around 800° C.

Besides the case of the polyvinylsiloxane (where R is an alkenyl type radical) to following polysiloxanes have yielded excellent results when processed according to the invention:

polymethylsiloxane (alkyl type radical)
polyethylsiloxane (alkyl type radical)
polyphenylsiloxane (aryl type radical)

What we claim is:

1. A method of producing a precise silica insulating mask on predetermined areas of a semiconductor substrate, comprising the following steps:
    1. depositing a thin film of an organic resin upon said semiconductor substrate, said resin consisting of polysiloxane of the structure:

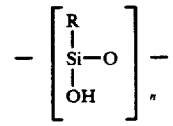

where n is an integer ranging from 2 to about 30, and where R is an alkyl, aryl or alkenyl group;
    2. irradiating and scanning said film by an electron beam, the width of the electron beam at the point of intersection with the surface of said resin of the order of 0.01 to 1 micron in diameter, according to a predetermined pattern of said mask thereby cross-linking and insolubilizing the exposed areas of said organic resin;
    3. eliminating the non-irradiated areas of the film by means of a solvent and
    4. thermally treating the irradiated film and substrate in a furnace and in an oxidizing atmosphere at a temperature ranging from 500 to 1000° C for about 2 hours, thereby converting the irradiated polysiloxane organic resin to a precise silica insulating mask impervious to penetration by a gas, liquid, or solid.

2. A method as claimed in claim 1, wherein said polysiloxane is polymethylsiloxane.

3. A method as claimed in claim 1, wherein said polysiloxane is polyethylsiloxane.

4. A method as claimed in claim 1, wherein said polysiloxane is polyphenylsiloxane.

5. A method as claimed in claim 1, wherein said polysiloxane is polyvinylsiloxane.

6. A methof as claimed in claim 1, wherein said temperature is about 800° C and said atmosphere contains about 50% argon and 50% oxygen.

7. A method of producing a precise silica insulating mask on predetermined areas of a semiconductor substrate, comprising the following steps:

1. depositing a thin film of an organic resin upon said semiconductor substrate, said resin consisting of polysiloxane of the structure:

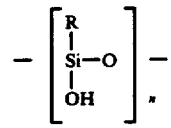

where $n$ is an integer ranging from 2 to about 30, and where R is an alkyl, aryl or alkenyl group;

2. irradiating and scanning said film by an electron beam of from 10,000 to 30,000 electron-volts, the width of the electron beam at the point of intersection with the surface of said resin in the order of 0.01 to 1 micron in diameter, according to the predetermined pattern of said mask thereby cross-linking and insolubilizing the exposed areas of said organic resin;

3. eliminating the non-irradiated areas of the film by means of a solvent and 4. thermally treating the irradiated film and substrate in a furnace and in an oxidizing atmosphere at a temperature ranging from 500° to 1000° C for about two hours, thereby converting the irradiated polysiloxane organic resin to a precise silica insulating mask impervious to penetration by a gas, liquid, or solid.

* * * * *